(12) United States Patent
Lundberg

(10) Patent No.: US 6,992,518 B2
(45) Date of Patent: Jan. 31, 2006

(54) INPUT RECEIVER WITH HYSTERESIS

(75) Inventor: James R. Lundberg, Austin, TX (US)

(73) Assignee: VIA Technologies, Inc., Taipei (TW)

( * ) Notice: Subject to any disclaimer, the term of this patent is extended or adjusted under 35 U.S.C. 154(b) by 16 days.

(21) Appl. No.: 10/833,806

(22) Filed: Apr. 28, 2004

(65) Prior Publication Data

US 2004/0212414 A1    Oct. 28, 2004

Related U.S. Application Data

(60) Provisional application No. 60/472,145, filed on Apr. 28, 2003.

(51) Int. Cl.
*H03K 3/037* (2006.01)
(52) U.S. Cl. .......................... 327/206; 327/73; 327/77
(58) Field of Classification Search ................ 327/205, 327/206, 68, 70, 72, 73, 77, 80, 81, 85, 87, 327/108, 109, 111, 112; 326/82, 83, 26, 326/27
See application file for complete search history.

(56) References Cited

U.S. PATENT DOCUMENTS

| | | | | |
|---|---|---|---|---|
| 4,535,294 A | | 8/1985 | Ericksen et al. ............ 328/150 |
| 5,369,319 A | * | 11/1994 | Good et al. ................. 327/206 |
| 5,973,534 A | * | 10/1999 | Singh ......................... 327/309 |
| 6,249,162 B1 | * | 6/2001 | Inoue ......................... 327/205 |
| 6,281,702 B1 | | 8/2001 | Hui ............................. 326/30 |
| 6,281,731 B1 | | 8/2001 | Fifield et al. ............... 327/205 |
| 6,359,485 B1 | * | 3/2002 | Drapkin et al. ............. 327/206 |
| 6,665,354 B1 | | 12/2003 | Drapkin et al. ............. 375/316 |

* cited by examiner

*Primary Examiner*—Long Nguyen
(74) *Attorney, Agent, or Firm*—Gary R. Stanford; Richard K. Huffman; James W. Huffman

(57) ABSTRACT

An input receiver with hysteresis including a differential sense amplifier, a reference circuit having a reference node providing a reference signal at a nominal threshold voltage level, and a switching stack device. The amplifier has a first input which receives an input signal, a second input coupled to the reference node, and an output which provides an output signal having first and second states indicative of the input signal. The switching stack device operates to adjust the reference signal based on the output signal between upper and lower threshold levels in an opposite direction of the input signal. The reference circuit may be a voltage divider that divides a power voltage signal to develop the reference signal. The switching stack device may include a P-channel device and an N-channel device coupled to the voltage divider to adjust the threshold voltage level of the reference signal.

14 Claims, 3 Drawing Sheets

INPUT RECEIVER WITH HYSTERESIS

CROSS-REFERENCE TO RELATED APPLICATIONS

This application claims the benefit of U.S. Provisional Application Ser. No. 60/472,145, filed on Apr. 28, 2003, which is herein incorporated by reference for all intents and purposes.

This application is related to the following co-pending U.S. patent application, which is filed on the same day as this application, which has a common assignee and at least one common inventor, and which is herein incorporated by reference in its entirety for all intents and purposes:

| SERIAL NUMBER | FILING DATE | TITLE |
| --- | --- | --- |
| 10/833.401 | Apr. 28, 2004 | OVERVOLTAGE PROTECTION APPARATUS |

BACKGROUND OF THE INVENTION

1. Field of the Invention

The present invention relates to input receivers, and more particularly to a method and apparatus for providing hysteresis for an input receiver to provide a suitable noise margin for an input signal.

2. Description of the Related Art

In earlier integrated circuit (IC) designs, CMOS output drivers were configured as push-pull elements. Consequently, the noise on an output bus fluctuated significantly according to circuit temperature, supply voltage, and fabrication process differences. The noise also varied as a function of the number of devices that were bussed together.

In more recent years, as technological advances have resulted in the scaling of device size and voltage levels, designers have been forced to aggressively address noise problems on external busses in order to maximize the operating speed of circuits within a system. One aspect of more recent output driver solutions has been a move in the industry from push-pull output configurations to differential input receiver configurations. One side of a differential input receiver is supplied with a reference voltage and the other side is driven by an open drain N-channel device. The open drain N-channel devices are typically provided on-chip and bus pull-up terminations are provided either on-chip or externally, such as on a system motherboard or the like.

The aforementioned types of output drivers have become prevalent within the industry. One particular example of this prevalence is exhibited by the Pentium® x86 family of microprocessor products developed by Intel®. Pentium microprocessors employ open drain N-channel output devices to drive a 1.5 Volt (V) bus having a 1.0V reference threshold. More recent bus specifications contemplate lower voltage levels, such as a 1.25V bus having a 0.83V reference threshold. 56 ohm pull-up terminations are typically employed and, while no particular pull down impedance is specified, open drain output drivers are required to comply with bus switching and timing specifications. The industry has adopted the name Assisted Gunning Transceiver Logic (AGTL) to connote a comprehensive set of specifications for devices that interface to this type of bus. These devices are known as AGTL devices or AGTL logic or simply, AGTL.

Conventional input receivers are disadvantageous, however, in situations in which the input signal is noisy. The noisy input signal potentially causes false triggering and erroneous operation among other disadvantageous effects on the IC. For these receivers, their switching or triggering threshold is specified in terms of a voltage range surrounding a designed switching threshold. And the limits of this voltage range are largely established based upon variations in fabrication processes, operating temperature, and operating voltage. Other input devices such as Schmidt Trigger devices have been developed which provide hysteresis for an input signal, but the hysteresis benefits come at a cost of decreased speed, increased power consumption, additional bus loading, etc.

The noise problem is exacerbated by the reduction of voltage according to more recent bus specifications further reducing noise tolerance. It is desired to provide an input receiver that tolerates increased noise levels while maintaining proper logic operation at operative bus voltage levels, including the lower voltage levels associated with newer standards.

It is also desirable to provide an input receiver that can be employed in place of a conventional input receiver to provide increased noise immunity benefits without incurring the penalties associated with present day devices that employ hysteresis such as Schmidt Trigger devices.

SUMMARY OF THE INVENTION

An input receiver with hysteresis according to an embodiment of the present invention includes a differential sense amplifier, a reference circuit having a reference node developing a reference signal at a nominal threshold voltage level, and a switching stack device. The differential sense amplifier has a first input that receives an input signal, a second input coupled to a reference node, and an output that provides a first output signal having first and second states indicative of the input signal. The reference circuit provides the reference node developing the reference signal at the nominal threshold voltage level, where the reference circuit includes a voltage divider having a first intermediate node as the reference node that divides a power voltage signal to develop the reference signal. The stack device is coupled to the output of the differential sense amplifier and to the reference node. The stack device adjusts the reference signal between upper and lower threshold levels in an opposite direction of the input signal based on the first output signal. The stack device has a P-channel device and an N-channel device. The P-channel device includes a source coupled to the output of the differential sense amplifier, and includes a gate and a drain coupled to the reference node. The N-channel device includes a source coupled to the output of the differential sense amplifier, a drain coupled to the reference node, and a gate coupled to the voltage divider.

In one particular embodiment the input signal is provided to an inverting input of the differential sense amplifier, so that the first output signal switches in an opposite direction as the input signal. In this case, an inverter may be provided to invert the first output signal to provide a second output signal indicative of the input signal.

The reference circuit may be a voltage divider that divides a power voltage signal and that has a first intermediate node that forms the reference node to develop the reference signal. In a more specific embodiment, the voltage divider includes multiple P-channel devices coupled in series between the power voltage signal and ground. Each P-channel device has a bulk and a source coupled together and also has a gate and a drain coupled together. For an AGTL configuration, the first intermediate node provides the reference signal at a nominal level of approximately two-thirds of the power voltage signal.

The switching stack device may include a P-channel device and an N-channel device. The P-channel device has a source coupled to the output of the differential sense amplifier and a gate and a drain coupled to the reference node. The N-channel device has a source coupled to the output of the differential sense amplifier, a drain coupled to the reference node, and a gate coupled to the voltage divider. In this case, the voltage divider may include a second intermediate node coupled to the gate of the N-channel device. In the AGTL configuration, the first intermediate node has a nominal voltage level of approximately two-thirds of the power voltage signal, and the second intermediate node has a nominal voltage level of approximately one-third of the power voltage signal.

An integrated circuit (IC) according to an embodiment of the present invention includes a power pin and a ground pin that collectively receive a bus voltage, a differential amplifier powered by the bus voltage, a reference circuit, and a switch circuit. The differential amplifier has an inverting input receiving an input signal, a non-inverting input receiving a reference signal, and an output providing a digital signal with first and second states indicative of the input signal. The reference circuit is coupled between the power and ground pins and provides the reference signal at a nominal threshold voltage level, where the reference circuit includes a resistive voltage divider having a first intermediate node providing the reference signal. The switch circuit is coupled to the output of the differential amplifier and adjusts the reference signal to upper and lower threshold voltage levels above and below the nominal threshold voltage level based on the state of the digital signal. The switch circuit includes a P-channel device and an N-channel device. The a P-channel device has a source coupled to the output of the differential sense amplifier, and has a gate and a drain coupled to the reference node. The N-channel device has a source coupled to the output of the differential sense amplifier, a drain coupled to the reference node, and a gate coupled to the voltage divider.

The reference circuit may be configured as a resistive voltage divider having a first intermediate node providing the reference signal. For example, the resistive voltage divider may include multiple P-channel devices stacked between the power and ground pins. Each P-channel device includes a bulk and source coupled together and a gate and drain coupled together to achieve uniform voltage division.

The voltage divider may include a second intermediate node and the switch circuit may include a P-channel device and an N-channel device. The P-channel device has a gate and drain coupled to the first intermediate node and a source coupled to the output of the differential amplifier. The N-channel device has a drain coupled to the first intermediate node, a gate coupled to the second intermediate node, and a source coupled to the output of the differential amplifier. In an AGTL configuration, the first intermediate node has a nominal voltage level of approximately two-thirds of the bus voltage and the second intermediate node has a nominal voltage level of approximately one-third of the bus voltage.

A method of configuring a differential input receiver with hysteresis according to an embodiment of the present invention includes providing a reference node with a nominal threshold voltage level, where the providing a reference node includes stacking a plurality of first P-channel devices with an intermediate node between source voltage terminals; comparing the voltage of the reference node with the voltage of an input signal using a differential sense amplifier, which switches between a higher voltage level and a lower voltage level; increasing the voltage of the reference node to an upper threshold voltage when the differential sense amplifier is switched to the higher voltage level, where the increasing includes activating a second P-channel device coupled to the plurality of first P-channel devices; and decreasing the voltage of the reference node to a lower threshold voltage when the differential sense amplifier is switched to the lower voltage level.

The reference node may be provided by stacking P-channel devices between source voltage terminals to form an intermediate node. Increasing the voltage of the reference node to an upper threshold voltage may include activating another P-channel device coupled to the stack of P-channel devices. Decreasing the voltage of the reference node to a lower threshold voltage may include activating an N-channel device coupled to the stack of P-channel devices. Comparing the voltage of the reference node with the voltage of an input signal using a differential sense amplifier may include switching the differential sense amplifier to the higher voltage level when the voltage of the input signal falls below the lower threshold voltage and switching the differential sense amplifier to the lower voltage level when the voltage of the input signal rises above the upper threshold voltage.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors of the present application have recognized the need for an input receiver with suitable noise margin for input signals. They have therefore developed an apparatus and method for providing an input receiver with hysteresis that exhibits a significant increase in noise margin over conventional input receivers, as will be further described below with respect to FIGS. 1–4.

Figure 1:
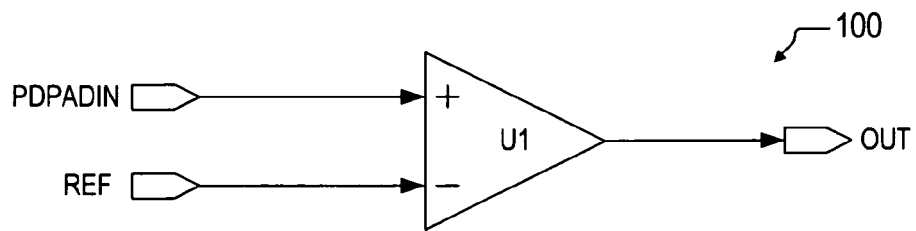
FIG. 1 is a schematic diagram illustrating a conventional receiver for use in an open drain bus configuration according to AGTL.

FIG. 1 is a schematic diagram illustrating a conventional input receiver 100 for use in an open drain bus configuration according to AGTL. The input receiver 100 includes a differential sense amplifier U1 having an inverting input receiving a reference signal REF, a non-inverting input receiving an input signal PDPADIN, and an output providing an output signal OUT. The REF signal is derived from a bus power signal VTT to a switching threshold voltage level, where the REF and VTT signals are generated off-chip and supplied to the chip via pads (not shown). In one AGTL configuration, the bus power signal VTT is approximately 1.5V and the REF signal is established at a threshold level of ⅔ of VTT, or approximately 1.0V. It is desired that U1 switch when the PDPADIN signal transitions through REF. In the configuration shown, the OUT signal is low when PDPADIN is less than REF and OUT goes high when PDPADIN transitions above REF.

The input receiver 100 is disadvantageous in situations in which the input signal PDPADIN is noisy. Furthermore, if VTT is reduced to 1.25V according to more recent bus specifications, then the REF signal is reduced to a threshold level of approximately 0.83V (⅔ of 1.25V). The noise margin for the newer bus specifications is reduced by a proportionate amount making the noise problem even more difficult to overcome. As noted above, other input devices such as Schmidt Trigger devices have been developed which provide hysteresis for an input signal, but the hysteresis benefits come at a cost of decreased speed, increased power consumption, additional bus loading, etc.

Figure 2:
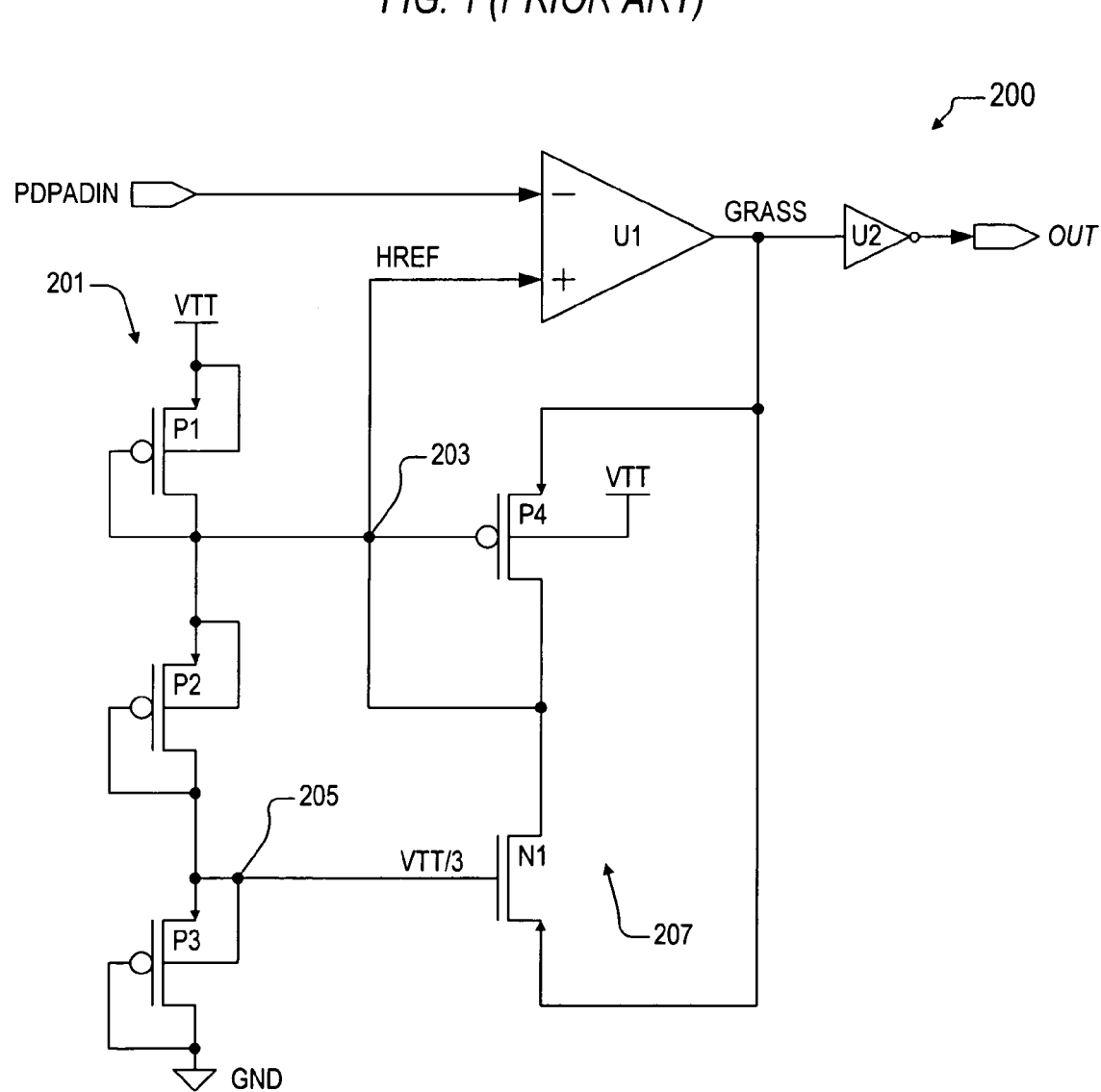
FIG. 2 is a schematic diagram illustrating an exemplary receiver for use in an open drain bus configuration according to AGTL implemented according to an embodiment of the present invention.

FIG. 2 is a schematic diagram illustrating an exemplary input receiver 200 for use in an open drain bus configuration according to AGTL implemented according to an embodiment of the present invention. A differential sense amplifier U1 is included having an input receiving the input signal PDPADIN. For the input receiver 200, however, the PDPADIN is provided to the inverting input of the differential sense amplifier U1, and another reference signal HREF with hysteresis is provided to the non-inverting input. The differential sense amplifier U1 asserts a signal GRASS at its output, where the GRASS signal has an inverted state relative to the state of PDPADIN. An inverter U2 is provided having an input receiving the GRASS signal and an output providing the OUT signal which is a non-inverted version of the PDPADIN signal.

The HREF signal is derived from VTT and has a nominal threshold value similar to the REF signal of the conventional differential input receiver 100. According to the AGTL configuration, if VTT is 1.5V, then HREF has a nominal threshold value of 1.0V, and if VTT is 1.25V, then HREF has a nominal threshold value of 0.83V. AGTL embodiments are exemplary only and other voltage levels or modes of operation are contemplated. The HREF signal is not received from an off-chip source but instead is generated on-chip. Furthermore, the HREF signal has two operative voltage levels, including a first slightly above the nominal threshold voltage level and a second slightly below the nominal threshold voltage level. The applicable threshold voltage level depends upon the state of the GRASS signal. In this manner, the HREF signal is not at a single voltage level but instead incorporates hysteresis for increased noise margin, as further described below.

A voltage divider 201 implements a reference circuit for developing the nominal level of the HREF signal. The voltage divider 201 is formed by stacking three substantially identical P-channel devices P1, P2 and P3 in series between VTT and a reference terminal or pin, such as ground (GND). In particular, P1 has its source coupled to VTT, and has its drain and gate coupled together at a first intermediate node 203 which develops the HREF signal. P2 has its source coupled to the node 203, and has its drain and gate coupled together at a second intermediate node 205. P3 has its source coupled to the node 203, and has its drain and gate coupled to GND. Each of the P-channel devices P1–P3 have a bulk (or N-well or "well tie") connection tied to its respective source. Thus, the source and bulk of P1 is at the voltage level of VTT and the gate and drain of P3 are both at GND. The gate and drain of P1 has the same voltage level as the source and bulk of P2, and the gate and drain of P2 has the same voltage level as the source and bulk of P3. The voltage divider 201 is thus formed with a symmetrical configuration to evenly divide VTT by three, so that the nominal voltage level of the node 203 is approximately two-thirds (⅔) VTT and the voltage level of the node 205 is approximately one-third (⅓) VTT.

The input receiver 200 includes a "weak" device stack 207, which has a P-channel device P4 and an N-channel device N1. The GRASS signal is provided to the sources of N1 and P4. The drains of N1 and P4 and the gate of P4 are coupled together at the node 203. The gate of N1 is coupled to the node 205 and P4 has a bulk connected to VTT. In an alternative configuration, the bulk nodes of both N1 and P4 can be connected to signal GRASS. The device stack 207 operates as a switch circuit that slightly increases or slightly decreases the threshold voltage level of HREF signal provided on the node 203 in response to transitions of the GRASS signal. The differential sense amplifier U1 transitions the GRASS signal between high and low threshold voltages in response to transitions of the PDPADIN input signal relative to the HREF signal. The voltage level of the HREF signal is increased or decreased in a direction opposite to the direction of the transition of the PDPADIN signal thus providing hysteresis according to the switching of the GRASS signal. In the configuration shown, the P-channel devices P1–P3 have substantially identical sizes relative to each other. The devices N1 and P4 are weak devices relative to devices P1–P3. As described further below, hysteresis operation is adjusted by adjusting the relative sizes of N1 and P4 relative to the sizes of the devices P1–P3.

Figure 3:
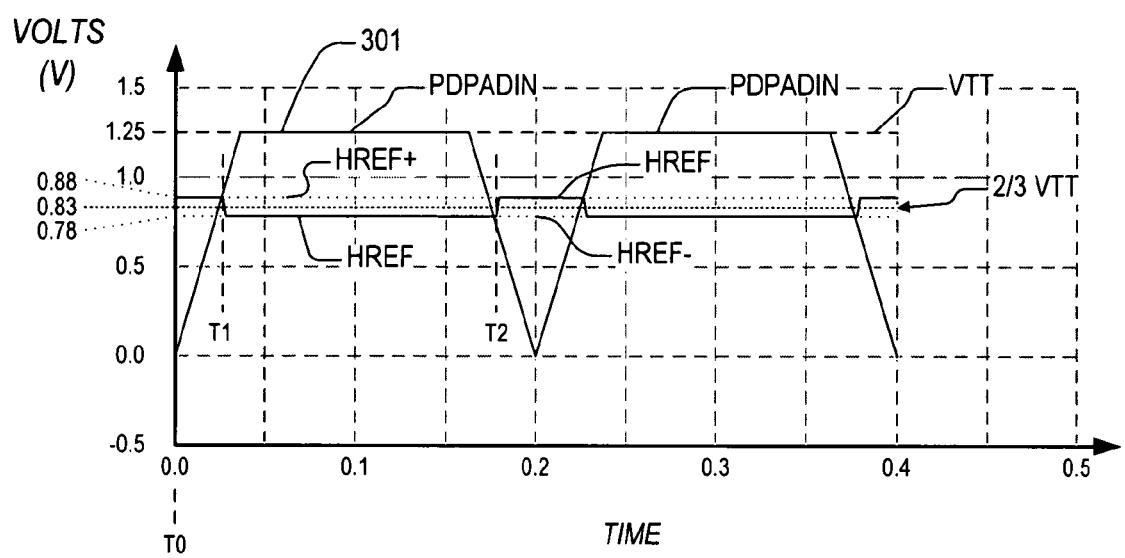
FIG. 3 is a timing diagram illustrating operation of the input receiver of FIG. 2.

FIG. 3 is a timing diagram illustrating operation of the input receiver 200, where the voltage levels of the PDPADIN and HREF signals are plotted in VOLTS versus TIME. The scale of TIME is arbitrary and depends upon the particular implementation and/or application. The PDPADIN signal is shown as a periodic waveform oscillating or otherwise switching between 0.0V and about 1.25V. VTT is shown as a dashed line having a voltage level of approximately 1.25V according to an AGTL configuration. The nominal threshold voltage level of HREF is approximately 0.83V, shown as a first dotted line labeled ⅔ VTT. At an initial time T0 (TIME=0.0 of arbitrary scale), the PDPADIN signal is at its minimum level of 0V. When PDPADIN has a voltage level below the HREF signal, the GRASS signal is asserted high. When GRASS is high, N1 is turned off and P4 is turned on. When N1 is turned off and P4 is turned on, the HREF signal at node 203 is pulled higher than the nominal threshold voltage level of ⅔ VTT. In the configuration illustrated, P4 is a relatively weak device compared to P1–P3, so that HREF is increased by approximately 50 millivolts (mV) above ⅔ VTT, or to approximately 0.88V, which is shown as an upper threshold voltage level HREF+. Thus, at time T0 while PDPADIN is below HREF, HREF is initially at the upper threshold voltage level HREF+.

The PDPADIN signal rises until it reaches and exceeds the HREF+ level at a time T1, at which time the differential sense amplifier U1 switches and pulls the GRASS signal low. When GRASS is low, P4 is turned off and N1 is turned on. When P4 is off and N1 is on, the HREF signal at node 203 is pulled lower than the nominal threshold voltage level of ⅔ VTT. In the configuration illustrated, N1 is a relatively weak device compared to P1–P3, so that HREF is decreased by approximately 50 mV below ⅔ VTT, or to approximately 0.78V, shown as a lower threshold voltage level HREF−. Thus, at about time T1 when PDPADIN rises above HREF at the upper HREF+ level, the HREF signal is pulled low to the lower voltage level HREF−. The PDPADIN signal continues to increase to a peak shown at 301, and then decreases again until it falls to the voltage level HREF− at a time T2. When PDPADIN falls below HREF− at time T2, the differential sense amplifier U1 switches and pulls the GRASS signal high. When the GRASS signal goes high, N1 is turned off and P4 is turned back on, so that the HREF signal switches back to the upper voltage level HREF+. Operation continues in a similar manner over time. The OUT signal transitions in response to transitions of the GRASS signal, and provides a non-inverted representation of the PDPADIN signal.

The exemplary embodiment illustrated by the input receiver 200 and the timing diagram of FIG. 3 shows hysteresis on the HREF signal of approximately 100 mV relative to its nominal value of ⅔ VTT. 100 mV of hysteresis provides sufficient input noise margin for many applications, without incurring the aforementioned disadvantageous effects associated with present day hysteresis devices such as Schmidt Trigger devices. The PDPADIN signal is shown as a periodic signal for purposes of illustration, but can instead be any type of signal including binary or digital logic signals. Although the PDPADIN signal is shown as a relatively clean signal, a noise signal of up to several tens of mV may be added to PDPADIN without disturbing proper switching operation. In particular, the hysteresis on the HREF signal enables proper switching of the differential sense amplifier U1 while preventing false triggering or oscillations of the GRASS signal. The amount of hysteresis is adjusted by modifying the sizes of N1 and P4 relative to the P-channel stack devices P1–P3 as appreciated by those skilled in the art.

The P-channel devices P1–P3 are configured as relatively precise and equal resistive devices equally dividing the voltage level of VTT to achieve the ⅔ VTT voltage level used as the threshold voltage level for purposes of comparison and switching. The differential sense amplifier U1 receives power directly or indirectly from the VTT signal and switches the GRASS signal within the VTT to GND voltage range. Thus, when P4 is on and N1 is off, P4 is effectively placed in parallel with P1 reducing the total resistance between VTT and the node 203 thereby increasing the voltage level of HREF to the upper threshold level HREF+. Also, when P4 is off and N1 is on, N1 is effectively placed in parallel with P2 and P3 reducing the total resistance between GND and the node 203 thereby decreasing the voltage level of HREF to the lower threshold level HREF−. Alternative configurations are contemplated, such as configuring the voltage divider 201 with resistors or other resistive type devices. In addition or in the alternative, the devices N1 and P4 may be replaced with resistive type devices and switching circuitry responsive to the GRASS signal for adjusting the HREF signal between the threshold voltage levels HREF+ and HREF−.

Figure 4:
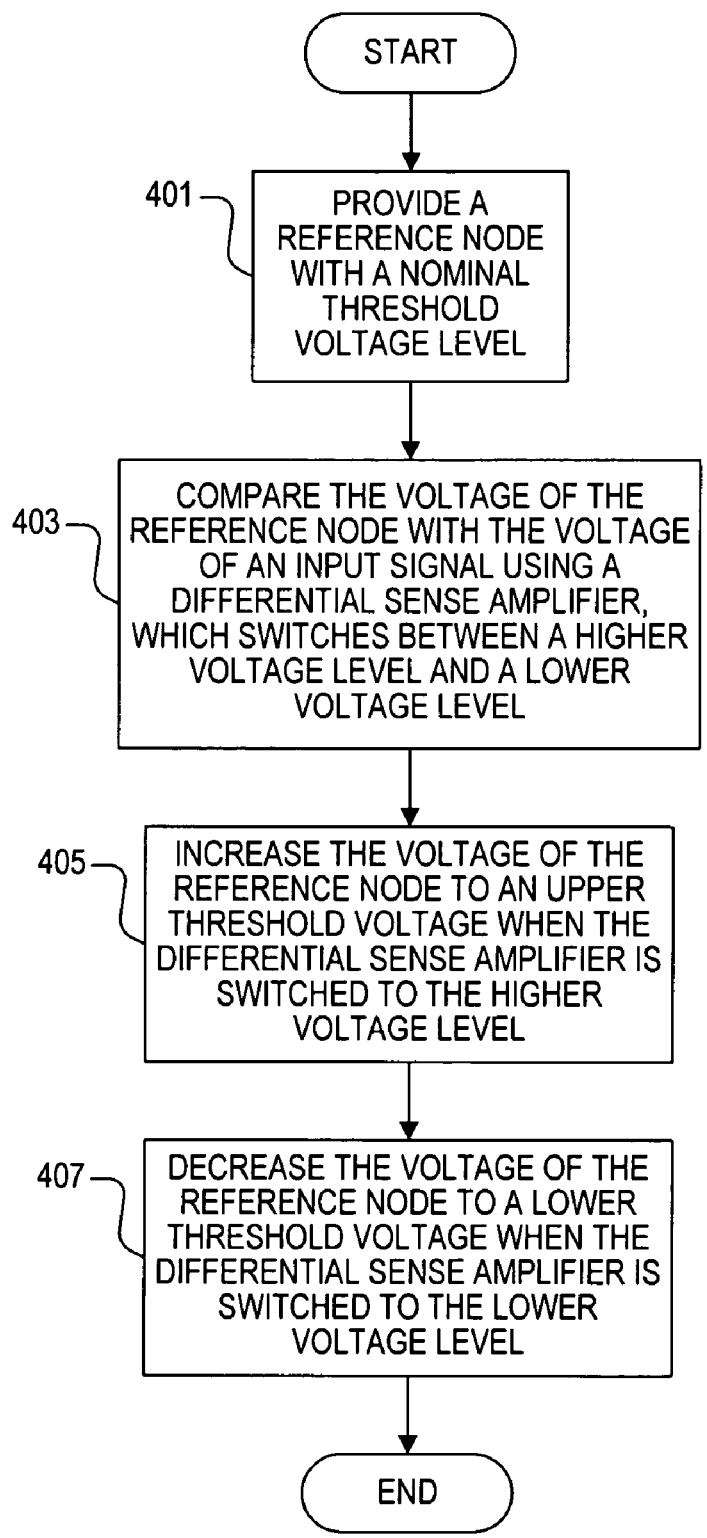
FIG. 4 is a flowchart diagram illustrating a method of configuring an input receiver with hysteresis according to an exemplary embodiment of the present invention.

FIG. 4 is a flowchart diagram illustrating a method of configuring a differential input receiver with hysteresis according to an exemplary embodiment of the present invention. At a first block 401, a reference node is provided with a nominal threshold voltage level. In the embodiment illustrated, this is achieved by stacking P-channel devices with an intermediate node between a bus source voltage (VTT and GND). At next block 403, the voltage of the reference node is compared with the voltage of an input signal using a differential sense amplifier, which switches between a higher voltage level and a lower voltage level. In one embodiment, the differential sense amplifier switches to the higher voltage level when the voltage of the input signal falls below a lower threshold voltage and switches to the lower voltage level when the voltage of the input signal rises above an upper threshold voltage. Also, the differential sense amplifier receives the bus voltage VTT and switches within the VTT voltage range.

At next block 405, the voltage of the reference node is increased to the upper threshold voltage when the differential sense amplifier is switched to the higher voltage level. In the embodiment illustrated, this is achieved by activating a second P-channel device coupled to a stack of first P-channel devices. And at next block 407, the voltage of the reference node is decreased to the lower threshold voltage when the differential sense amplifier is switched to the lower voltage level. In the embodiment illustrated, this is achieved by activating an N-channel device coupled to the stack of first P-channel devices.

A differential receiver implemented according to embodiments of the present invention provides several benefits and advantages over conventional receivers. The present invention enables a designer to provide a differential receiver in an IC or chip that exhibits a significant increase in noise margin over that which has heretofore been provided. The differential input receiver 200, for example, may be implemented on an IC receiving the VTT bus source voltage from an external source. In the embodiment illustrated, the HREF signal is developed internally based on the VTT signal. The PDPADIN signal may be provided from an external source or from an internal source. The hysteresis of the HREF signal protects against a noisy PDPADIN signal. The amount of hysteresis may be increased by adjusting the relative sizes of the stack devices as described herein. The present invention provides a significant advantage for differential input receivers operative at lower voltage levels, such as according to the more recent bus specifications which contemplate a 1.25V bus having a 0.83V threshold.

Although the present invention has been described in considerable detail with reference to certain preferred versions thereof, other versions and variations are possible and contemplated. For example, the voltage divider 201 may alternatively be implemented using resistors or other resistive devices, which may or may not be precision devices or components. Also, the devices P4 and N1 may be replaced with resistive devices and electronic switches or the like.

In addition, although the present invention has been characterized in terms of AGTL bus specifications and input levels, the present inventors note that the scope of the present invention extends beyond AGTL to any application requiring input threshold noise immunity.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. An input receiver with hysteresis, comprising:
a differential sense amplifier having a first input that receives an input signal, a second input coupled to a reference node, and an output that provides a first output signal having first and second states indicative of said input signal;
a reference circuit providing said reference node developing a reference signal at a nominal threshold voltage level, wherein said reference circuit comprises a voltage divider having a first intermediate node as said reference node that divides a power voltage signal to develop said reference signal; and
a stack device, coupled to said output of said differential sense amplifier and to said reference node, that adjusts said reference signal between upper and lower threshold levels in an opposite direction of said input signal based on said first output signal, wherein said stack device comprises:
a P-channel device having a source coupled to said output of said differential sense amplifier, and having a gate and a drain coupled to said reference node; and
an N-channel device having a source coupled to said output of said differential sense amplifier, a drain coupled to said reference node, and a gate coupled to said voltage divider.

2. The input receiver of claim 1, wherein said voltage divider comprises a plurality of P-channel devices coupled in series between said power voltage signal and ground.

3. The receiver of claim 2, wherein each P-channel device has a bulk and a source coupled together and also has a gate and a drain coupled together.

4. The receiver of claim 1, wherein said first intermediate node provides said reference signal at a nominal level of approximately two-thirds of said power voltage signal.

5. The receiver of claim 1, wherein said voltage divider includes a second intermediate node coupled to said gate of said N-channel device.

6. The receiver of claim 5, wherein said first intermediate node has a nominal voltage level of approximately two-thirds of said power voltage signal, and wherein said second intermediate node has a nominal voltage level of approximately one-third of said power voltage signal.

7. The receiver of claim 1, further comprising:
said input signal provided to an inverting input of said differential sense amplifier, wherein said first output signal switches in an opposite direction as said input signal; and
an inverter having an input coupled to said output of said differential sense amplifier and an output providing a second output signal indicative of said input signal.

8. An integrated circuit (IC), comprising:
a power pin and a ground pin that collectively receive a bus voltage;
a differential amplifier powered by said bus voltage and having an inverting input receiving an input signal, a non-inverting input receiving a reference signal, and an output providing a digital signal with first and second states indicative of said input signal;
a reference circuit coupled between said power and ground pins and providing said reference signal at a nominal threshold voltage level, wherein said reference circuit comprises a resistive voltage divider having a first intermediate node providing said reference signal; and
a switch circuit, coupled to said output of said differential amplifier, that adjusts said reference signal to upper and lower threshold voltage levels above and below said nominal threshold voltage level based on said digital signal, wherein said switch circuit comprises:
a first P-channel device having a gate and drain coupled to said first intermediate node and a source coupled to said output of said differential amplifier; and
an N-channel device having a drain coupled to said first intermediate node, a gate coupled to a second intermediate node of said voltage divider, and a source coupled to said output of said differential amplifier.

9. The IC of claim 8, wherein said resistive voltage divider comprises a plurality of P-channel devices stacked between said power and ground pins.

10. The IC of claim 9, wherein each of said plurality of stacked P-channel devices includes a bulk and source coupled together and a gate and drain coupled together.

11. The IC of claim 8, wherein said first intermediate node has a nominal voltage level of approximately two-thirds of said bus voltage and wherein said second intermediate node has a nominal voltage level of approximately one-third of said bus voltage.

12. A method of configuring an input receiver with hysteresis, comprising:
providing a reference node with a nominal threshold voltage level, wherein said providing a reference node comprises stacking a plurality of first P-channel devices with an intermediate node between source voltage terminals;
comparing the voltage of the reference node with the voltage of an input signal using a differential sense amplifier, which switches between a higher voltage level and a lower voltage level;
increasing the voltage of the reference node to an upper threshold voltage when the differential sense amplifier is switched to the higher voltage levels wherein said increasing comprises activating a second P-channel device coupled to said plurality of first P-channel devices; and
decreasing the voltage of the reference node to a lower threshold voltage when the differential sense amplifier is switched to the lower voltage level.

13. The method of claim 12, wherein said decreasing comprises activating an N-channel device coupled to said plurality of first P-channel devices.

14. The method of claim 12, wherein said comparing comprises switching the differential sense amplifier to the higher voltage level when the voltage of the input signal falls below the lower threshold voltage and switching the differential sense amplifier to the lower voltage level when the voltage of the input signal rises above the upper threshold voltage.

* * * * *